United States Patent
Lui et al.

(10) Patent No.: US 6,929,901 B2
(45) Date of Patent: Aug. 16, 2005

(54) METHOD FOR REWORKING A LITHOGRAPHIC PROCESS TO PROVIDE AN UNDAMAGED AND RESIDUE FREE ARC LAYER

(75) Inventors: Ai-Sen Lui, Hsin chu (TW); Chun-Hsien Lin, Hsin Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 179 days.

(21) Appl. No.: 10/323,376

(22) Filed: Dec. 18, 2002

(65) Prior Publication Data

US 2004/0121269 A1 Jun. 24, 2004

(51) Int. Cl.$^7$ .................................................. G03F 7/42
(52) U.S. Cl. ........................ 430/329; 430/322; 134/1.3
(58) Field of Search .................................. 430/329, 330, 430/311, 322, 331; 134/1, 1.3

(56) References Cited

U.S. PATENT DOCUMENTS 6,737,225 B2 * 5/2004 Miller ........................ 430/329
2004/0050406 A1 * 3/2004 Sehgal ........................ 134/26

* cited by examiner

Primary Examiner—Kathleen Duda

(57) ABSTRACT

A method of removing resinous organic material over a semiconductor process surface including providing a semiconductor wafer having a process surface comprising a resinous organic material; and, exposing the process surface to a supercritical $CO_2$ containing medium further comprising at least a first solvent for a predetermined period to produce a substantially resinous organic material free and undamaged process surface.

25 Claims, 2 Drawing Sheets

METHOD FOR REWORKING A LITHOGRAPHIC PROCESS TO PROVIDE AN UNDAMAGED AND RESIDUE FREE ARC LAYER

FIELD OF THE INVENTION

This invention generally relates to lithographic methods for forming microelectronic integrated circuits in a semiconductor wafer manufacturing process and more particularly to a method for reworking the lithographic process including removing a photoresist layer to provide a residue free and undamaged anti-reflectance coating (ARC) layer for a subsequent lithographic patterning process.

BACKGROUND OF THE INVENTION

In semiconductor device manufacturing, lithography is typically used to transfer a pattern for forming semiconductor features onto the semiconductor wafer for the formation of multi-layered structures to form integrated circuits. During a lithographic process, also commonly referred to as a photolithographic process, radiant energy having relatively small wavelengths such as ultraviolet light is passed through a mask, also referred to as a reticle, to expose a radiant energy sensitive material such as photoresist, also frequently referred to as resist, formed on the wafer process surface. The mask includes predetermined circuitry patterns having regions of attenuating and non-attenuating regions where the radiant energy intensity is modulated. For example, ultraviolet (UV) light passed through the mask onto the photoresist causes chemical reactions in the exposed portion of the photoresist, altering it properties. Upon development of the photoresist resist, exposed portions are removed in the case of a positive photoresist, and non-exposed portions are removed in the case of a negative photoresist.

As semiconductor device feature sizes have decreased to sizes smaller than the wavelength of light used in photolithographic processes, the reflection of light during the patterning process from layers underlying the photoresist layer cause the unintentional exposure of photoresist portions at a bottom portion of the photoresist layer thereby causing widening or undercutting of the pattern at the resist/wafer process surface interface. As a result, critical dimensions are compromised during a subsequent dry etching process.

Anti-reflectance coating (ARC) layers, also frequently referred to as dielectric anti-reflectance coatings (DARC), and bottom anti-reflectance coatings (BARC) are known in the semiconductor microelectronic IC fabrication process for reducing light reflections during a photolithographic exposure process. For example, a layer of material having a desired index of refraction and thickness is fabricated to reduce light reflections from the ARC layer surface and an underlying layer, for example an etching stop layer. For example, the dielectric layer may be tuned to produce index of refraction matching at the interface of the ARC layer and underlying layer. Several ARC formulations are known in the art, for example, including an ARC formed of silicon oxynitride (e.g., $Si_xO_yN$), whose optical properties may be selected during a CVD formation process.

Frequently, photolithographic patterning processes fail for several reasons. For example, the photo-exposure process may result in slight misalignment of a patterned reticle or a slight misalignment in a stepped exposure process, where the post exposure photoresist development process may unexpectedly produce unacceptable feature pattern profiles, and so on. Following a photolithographic patterning process, the patterned photoresist layer is subjected to inspection, for example by scanning electron or optical microscopic methods, to assure proper critical dimensions. Photolithographic processes are repeated several times in the course of producing a multi-layer semiconductor device having several device levels. As a result, in a failed photolithographic patterning process, it is critical to be able to salvage the wafer by reworking or re-patterning a second photoresist layer in a reworked photolithographic patterning process.

One problem according to prior art process of reworked photolithographic patterning processes is remaining photoresist residue or damaged areas on the ARC layer surface. For example, prior art processes typically use a dry etching process, referred to as an ashing process, where an oxygen containing plasma is used to remove the photoresist layer. During the etching process, portions of the ARC layer are damaged, causing optical properties including a refractive index and extinction coefficient to be altered, thereby altering the light reflection absorbing properties of the ARC layer. In addition, frequently during the ashing process, photoresist residues are formed that are resistant to the ashing process, leaving residues on the process surface, thereby necessitating an additional wet etching process to remove the residues. As a result, a process cycle is increased and a wafer yield is reduced.

Thus, there is a need in the semiconductor manufacturing art for an improved method for reworking a lithographic process to avoid damage to, and resist residues remaining on, ARC layer surfaces.

It is therefore an object of the invention to provide an improved method for reworking a lithographic process to avoid damage to, and resist residues remaining on, ARC layer surfaces while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method for removing resinous organic material over a semiconductor process surface.

In a first embodiment, the method includes providing a semiconductor wafer having a process surface comprising a resinous organic material; and, exposing the process surface to a super critical $CO_2$ containing medium further comprising at least a first solvent for a predetermined period to produce a substantially resinous organic material free and undamaged process surface.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1:
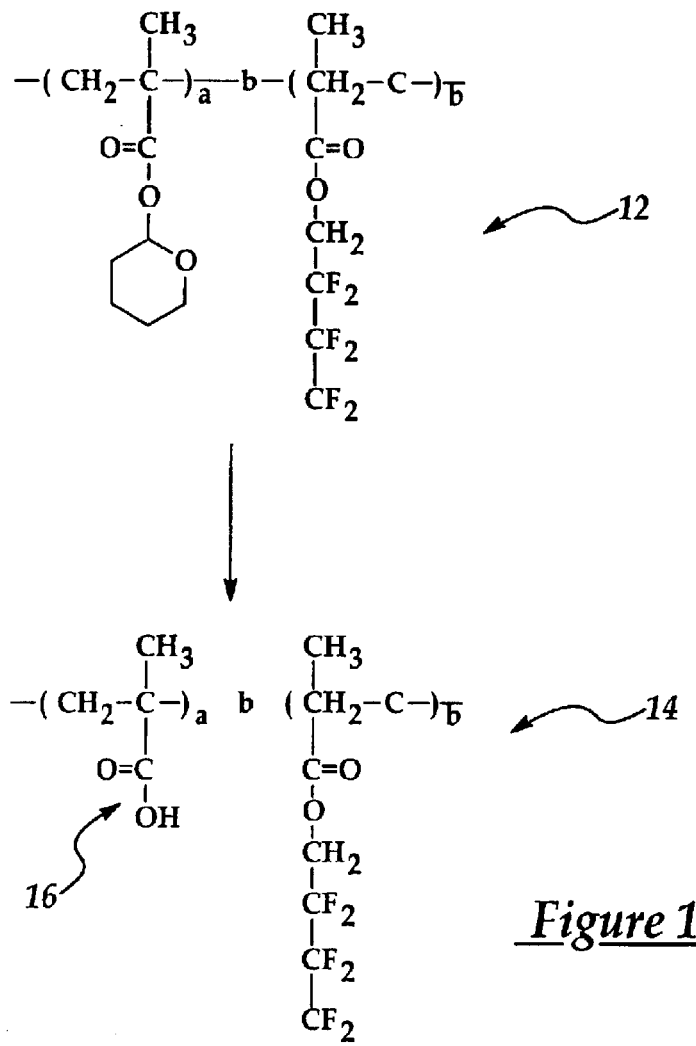
FIG. 1 is a schematic diagram of a portion of a photoresist including a photoacid generator showing production of an exemplary wet stripping resistant carboxylic agent following exposure to UV.

Although the method of the present invention is explained with respect to an exemplary embodiment of removing a resist layer overlying an anti-reflectance coating (ARC) layer, it will be appreciated that the method of the present invention may advantageously be used to remove resist overlying other layers where removing of the resist is advantageously accomplished without damage to an underlying layer. For example, avoiding damage to an underlying layer in an ashing process is also advantageous for removing resinous material remaining within semiconductor features following application of a resist or resinous material. It will be appreciated the method of the present invention may be used to remove any type of organic resinous material whether including a photoactive agent or not, but is particularly advantageously used to replace an ashing process where damage to an underlying layer may be avoided.

In a first embodiment of the present invention a semiconductor process wafer surface is provided comprising an organic resinous material, for example, a resist layer. The semiconductor process wafer surface is subjected to a supercritical $CO_2$ containing (supercritical $CO_2$) treatment including at least one solvent, and optionally a co-solvent to substantially remove the resist layer and produce a substantially damage free and residue free wafer process surface. Preferably the process is carried out such that a subsequent rinsing and drying step may be avoided.

In a preferred embodiment, the resist layer is provided over an anti-reflectance coating (ARC) layer also frequently referred to as dielectric anti-reflectance coatings (DARC) and bottom anti-reflectance coatings (BARC) as are known in the semiconductor microelectronic IC fabrication process for reducing light reflections during a photolithographic exposure process.

The method of the present invention may be applied to any type of ARC including organic and inorganic ARC's. In a preferred embodiment, the ARC is an inorganic ARC also referred to as a DARC, formed underlying the resist layer. For example, the DARC includes at least one of silicon oxynitride (e.g., $Si_xO_yN$) and silicon oxycarbide (e.g., $Si_xO_yC$) formed at a thickness of about 200 Angstroms to about 700 Angstroms.

The resist may include any resist including positive and negative resists activated by various radiation sources such as g, I line, DUV, electron beam, X-ray, ion beam, and the like. For example, the resist may include phenol-formaldehyde resins or poly(p-vinylphenol)cyclized polyisoprene, poly(p-vinylphenol), polymethylmethacrylate, and polybutene sulfone. In addition, multiple layer resists may be suitably treated by the method of the present invention including silylated resists. In a preferred embodiment, the resist layer is a DUV photoresist including a photoacid generator, for example a diazonaphthoquinone (DNQ)/novolac resist. Preferably, the DUV photoresist includes a photoacid generator (PAG) which produces a carboxylic acid upon exposure to a wavelength of light less than about 250 nm.

For example, referring to FIG. 1 is shown a portion of the chemical structure of a commercially available DUV photoresist before exposure, 12, and following exposure, 14, to DUV radiation, for example at about 193 nm. A carboxylic acid portion 16 is formed which is insoluble to commonly used photoresist strippers. As a result, a plasma ashing process is required to remove the photoresist. For example the ashing process may include $O_2$ or CO and an inert gas such as helium. However, conventional ashing processes result in damage to the underlying DARC layer. It has been found according to an embodiment of the present invention that a supercritical carbon dioxide ($CO_2$) containing treatment of a carboxylic acid containing resist layer of the present invention substantially removes the carboxylic acid containing photoresist without substantially affecting the index of refraction of the underlying DARC layer. For example the supercritical carbon dioxide ($CO_2$) containing treatment produces an ARC layer having substantially the same index of refraction as it had prior to the treatment. By the term "substantially the same" is meant a value within about 10 percent. More preferably, the index of refraction following the supercritical $CO_2$ containing treatment is within about 5 percent of the pre-treatment value.

It has been found that conventional methods of stripping the photoresist layer in a photolithographic reworking process, for example, using an ashing process to remove carboxylic acid containing photoresist, decreases the index of refraction from about 10% to about 20%. The index of refraction is critical for the proper suppression of reflections from the interface of an ARC and underlying layer, for example a silicon nitride etching stop layer. The anti-reflective functioning of the ARC layer is achieved by careful matching of the indexes of refraction of the ARC layer and the underlying layer. According to the resist stripping process of the present invention, the index of refraction is substantially unchanged while providing a substantially photoresist and chemical residue free surface.

Figure 2A:
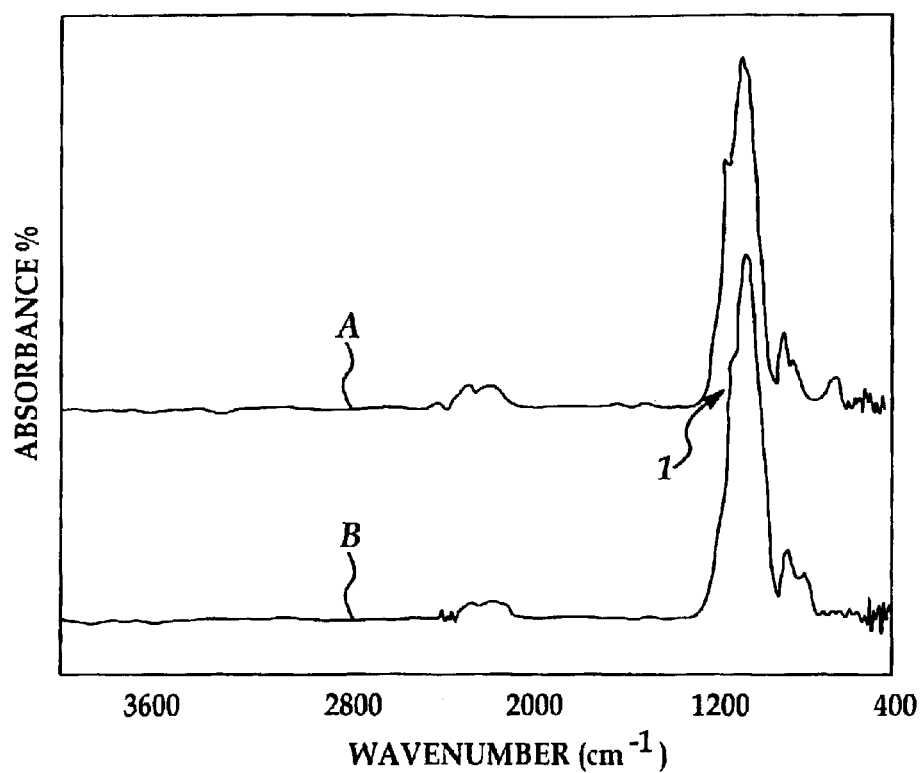
FIGS. 2A and 2B are exemplary FTIR spectrum of ARC layers following a prior art stripping method and the stripping method according to an embodiment of the present invention.
Figure 2B:
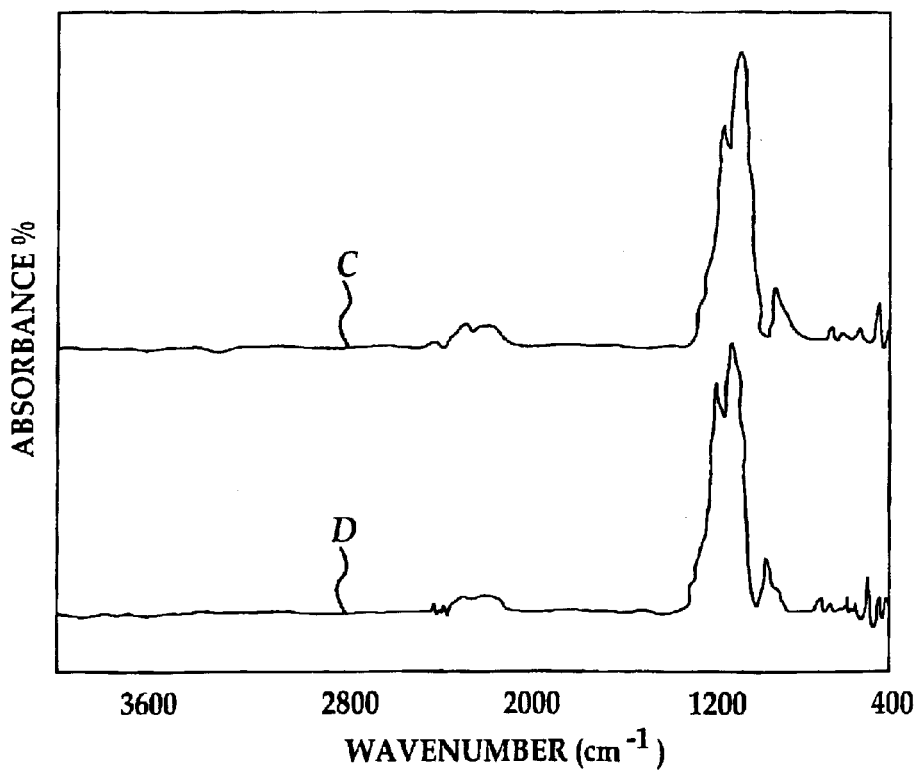

For example, referring to FIGS. 2A and 2B are shown exemplary FTIR spectra of a process wafer including a surface ARC layer. The frequency, in wave numbers ($cm^{-1}$), is shown on the horizontal axis and relative absorbency (%) on the vertical axis. An index of refraction is calculated by known methods from absorbency or reflectance spectra. For example, in FIG. 2A, is shown FTIR spectrum A of a DARC layer, including Si—C bond vibrational peaks and Si—O bond vibrational peaks from a silicon oxycarbide ARC prior to a DUV photolithographic patterning process. In contrast, line B shows the spectrum after performing a conventional ashing process to remove the DUV photoresist following photolithographic patterning. It is seen that the FTIR spectrum is degraded in vibrational mode peak definition (e.g., at peak area 1) corresponding to a reduction in the index of refraction of the ARC layer of about 8%. Referring to FIG. 2B, is shown FTIR spectrum C of the ARC layer prior to the same photolithographic patterning, contrasted with spectrum D, taken following photolithographic patterning and a supercritical $CO_2$ resist stripping process according to preferred embodiments. It is seen that no degradation of the spectrum has occurred, corresponding to substantially the same index of refraction following the supercritical $CO_2$ resist stripping process.

For example, in one embodiment of the invention the supercritical $CO_2$ resist stripping process includes the formation of a supercritical gas/fluid (medium) including $CO_2$ according to conventional means. For example, supercritical $CO_2$ including selected additives is heated from about 35° C. to about 85° C. at a pressure from about 2000 Psi to about 8000 Psi. More preferably, the supercritical $CO_2$ containing medium is formed by heating a $CO_2$ containing mixture at a temperature from about 50° C. to about 70° C. at a pressure of about 2500 psig to about 4000 psig. Preferably, the supercritical $CO_2$ containing medium is formed to have a viscosity on the order of $10^{-3}$, diffusivity on the order of about $10^{-2}$, and a density of about $700 \text{ kg/m}^3$. For example, methods of forming supercritical fluids are known in the art including supercritical reactors having means for controlling pressure and temperature. For example, the $CO_2$ may be added to the reactor chamber in liquid form with selected additives added to the liquid $CO_2$ before or after entering the reactor. One or more wafers are preferably added to the reactor chamber through a pressure lock to reduce a pressurization time during the treatment.

In one embodiment of the invention, at least one solvent is added to $CO_2$ to form the supercritical $CO_2$ stripping medium. For example, ketones, phenols, halogenated hydrocarbons, sulfonic acids, carboxylic acids, and mixtures thereof are added at a weight percent of about 3 weight percent to about 10 weight percent with respect to the total weight percent of the supercritical $CO_2$ containing medium.

In another embodiment, the solvent is selected from the group consisting of pyrrolidones, glycol ethers, esters, ketones, and sulfur oxides. For example, N-methyl-2-pyrrolidone (NMP), N-hydroxyethyl-2-pyrrolidone (HEP), diethylene glycol monobutylether, diethylene glycol, n-butyl acetate, amyl acetate, ethyl acetoacetate, isopropyl acetate and propylene glycol monomethyl ether acetate, methylethyl ketone, acetone, dimethylsulfoxide, and sulfolane.

In another embodiment, a co-solvent is added to the solvent to form a total weight percent of the solvent and the co-solvent between about 3 weight percent and about 10 weight percent with respect to the total weight percent of the supercritical $CO_2$ containing medium. Preferably, the co-solvent includes one or more amines. For example, the one or more amines are selected from the group consisting of alkyl, hydroxyalkyl, phenyl, alkylphenyl, hydroxyalkylphenyl, and alkanol groups.

In another embodiment, the co-solvent includes a surface active agent (surfactant) such as one or more fatty acid additives in the amount of about 0.1 weight % to about 3 weight % with respect to the total weight percent of the supercritical $CO_2$ containing medium. For example, the fatty acid additive is selected from the group consisting of capric acid, oleic acid, stearic acid, oleostearic acid, isostearic acid, hydroxystearic acid, linoleic acid, linolic acid, and buthylic acid. For example, the addition of a surface active agent to the supercritical $CO_2$ containing medium is believed to advantageously aid removal of chemical residues and water, if present, from the surface thereby making subsequent surface rinsing and drying steps unnecessary. The surfactant may be added to the supercritical $CO_2$ containing medium during a final portion of the resist removing treatment. Preferably, the resist removing supercritical $CO_2$ treatment is carried out for a period of about 15 seconds to about 90 seconds. For example, the surfactant may be added during the final half of the treatment time period. Following the supercritical $CO_2$ removing treatment, the temperature is lowered to about 35° C. to about 40° C. and the supercritical medium is exhausted from the reactor.

In another embodiment, water is optionally added to the solvent and co-solvent at a weight percent of about 0% to about 10% with respect to the total weight percent of the supercritical $CO_2$ containing medium. The addition of water to the supercritical $CO_2$ containing medium is believed to aid the solubility of water soluble additives.

In another embodiment, the co-solvent includes one or more corrosion inhibitors such as EDTA and Benzotriazole (BTA) including Benzotriazole derivatives such as Triazole, and Tritriazole added in an amount of about 0.01 to about 0.1 weight percent with respect to the total weight percent of the supercritical $CO_2$ containing medium. For example, in the case copper features are included on the semiconductor wafer surface, a corrosion inhibitor added to the supercritical $CO_2$ containing medium according to the preferred embodiments is believed to advantageously inhibit copper corrosion.

Figure 3:
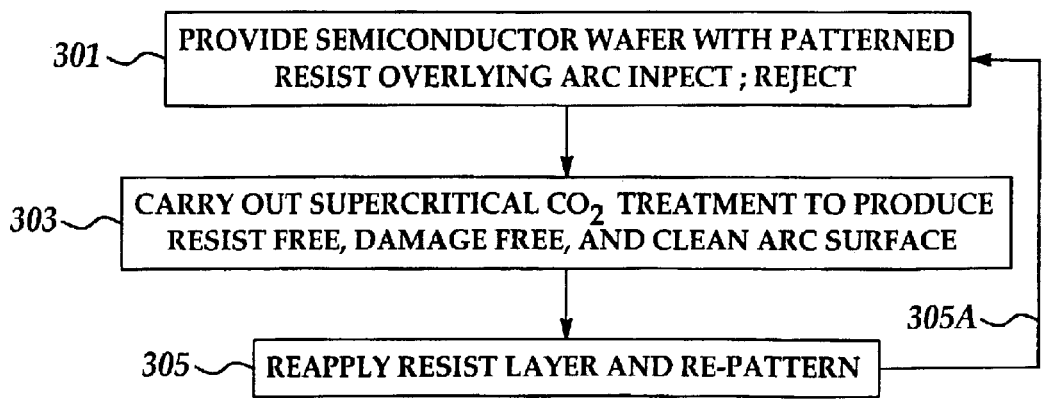
FIG. 3 is a process flow diagram including several embodiments of the present invention.

Referring to FIG. 3, is shown a simplified process flow diagram including several embodiments of the present invention. In process 301, a semiconductor process wafer including a patterned resist layer overlying an ARC layer is provided and inspected according to a photolithographic patterning process. In process 303, the resist layer is removed, for example in a reworking process following rejection due to a defectively patterned resist. The resist is removed using a supercritical $CO_2$ treatment process according to preferred embodiments to produce a resist free, damage free, chemical residue free (clean), and dry surface. In process 305 a subsequent resist layer is provided and re-patterned, and as indicated by process arrow 305A, the resist layer is inspected in process 301. If the re-patterned resist layer is rejected, the reworking process may be carried out indefinitely until an acceptable resist pattern is obtained.

The method of the present invention provides a method to remove resist overlying a semiconductor surface, and is particularly advantageous in removing resist otherwise insoluble in a wet stripping process, for example including a carboxylic containing acid generated from a PAG and DUV light. Further, the method avoids damage to underlying ARC layers caused by ashing methods required to remove photoresists. Consequently, a semiconductor wafer may be lithographically reworked without limit thereby improving a process wafer yield. Moreover, the method of the present invention, particularly with preferred additives makes a post-stripping cleaning and drying step unnecessary. The preferred supercritical $Co_2$ treatment processing times are further about the same as an ashing processes, thus a throughput is maintained or improved.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of removing a resist layer over a semiconductor process surface comprising the steps of:
   providing a semiconductor wafer having a process surface comprising said resist layer and an underlying anti-reflectance (ARC) layer; and,
   exposing the process surface to a supercritical $CO_2$ containing medium comprising at least a first solvent for a predetermined period to substantially remove the resist layer to leave the ARC layer in place with substantially the same anti-reflective properties.

2. The method of claim 1, wherein the substantially the same anti-reflective properties comprise an index of refraction.

3. The method of claim 1, wherein the ARC layer is selected from the group of silicon oxynitrides and silicon oxycarbides.

4. The method of claim 1, further comprising the step of forming a second resist layer over the semiconductor wafer process surface without an intervening rinsing or drying step.

5. The method of claim 1, wherein the resist layer comprises a carboxylic acid group.

6. The method of claim 1, wherein the resist layer comprises a patterned DUV photoresist layer comprising a photoacid generator.

7. The method of claim 1, wherein the resist layer comprises a compound selected from the group consisting of Novolak resins, phenol-formaldehyde resins, poly(p-vinylphenol) cyclized polyisoprene, poly (p-vinylphenol), polymethylmethacrylate, and polybutene sulfone.

8. The method of claim 1, wherein the at least a first solvent is selected from the group consisting of ketones, phenols, halogenated hydrocarbons, sulfonic acids and carboxylic acids.

9. The method of claim 1, wherein the at least a first solvent is selected from the group consisting of pyrrolidones, glycol ethers, esters, ketones, and sulfur oxides.

10. The method of claim 1, wherein the supercritical $CO_2$ containing medium comprises a co-solvent amine selected from the group consisting of alkyl amines, hydroxyalkyl amines, phenyl amines, alkylphenyl amines, and hydroxyalkylphenyl amines.

11. The method of claim 1, wherein the supercritical $CO_2$ containing medium comprises a surfactant.

12. The method of claim 1, wherein the supercritical $CO_2$ containing medium comprises a corrosion inhibitor selected form the group consisting of EDTA and Benzotriazole.

13. The method of claim 1, wherein the ARC layer comprises a dielectric.

14. The method of claim 1, wherein the step of exposing comprises a lithographic reworking process following patterning and inspection of the patterned resist layer.

15. A method of reworking a lithographically patterned semiconductor process wafer to preserve an anti-reflective property of an underlying anti-reflectance coating (ARC) layer comprising the steps of:

provided a semiconductor wafer having a process surface comprising an anti-reflectance coating (ARC) layer with predetermined anti-reflective properties and an overlying patterned first resist layer;

exposing the process surface to a supercritical $CO_2$ containing fluid comprising at least a first solvent for a predetermined period to expose the ARC layer with substantially the same predetermined anti-reflective properties; and, forming and patterning a second resist layer over the ARC layer.

16. The method of claim 15, wherein the first resist layer is insoluble in a resist stripping solution.

17. The method of claim 15, wherein the step of forming is carried out without an intervening rinsing or drying step.

18. The method of claim 15, wherein the first solvent is selected from the group consisting of ketones, phenols, halogenated hydrocarbons, sulfonic acids and carboxylic acids.

19. The method of claim 15, wherein the first solvent is selected from the group consisting of pyrrolidones, glycol ethers, esters, ketones, and sulfur oxides.

20. The method of claim 15, wherein the supercritical $CO_2$ containing fluid comprises a co-solvent amine selected from the group consisting of alkyl amines, hydroxyalkyl amines, phenyl amines, alkylphenyl amines, and hydroxyalkylphenyl amines.

21. The method of claim 15, wherein the supercritical $CO_2$ containing fluid comprises a surfactant during at least a portion of the step of exposing.

22. The method of claim 15, wherein the supercritical $CO_2$ containing fluid comprises a corrosion inhibitor selected form the group consisting of EDTA and Benzotriazole.

23. The method of claim 15, wherein the ARC layer comprises a dielectric.

24. The method of claim 15, further comprising the step of inspecting the patterned first resist layer critical dimensions prior to the step of exposing.

25. The method of claim 15, wherein the first and second resist layers comprise a photo-generated acid comprising a carboxylic acid.

* * * * *